(12) United States Patent
Malkamäki

(10) Patent No.: US 6,288,933 B1
(45) Date of Patent: Sep. 11, 2001

(54) ION DRIFT TUBE INVOLVING ANALOG MEMORY CELLS

(76) Inventor: Simo Malkamäki, Puolikonitie 6 C, FIN-20300, Turku (FI)

( * ) Notice: Subject to any disclaimer, the term of this patent is extended or adjusted under 35 U.S.C. 154(b) by 0 days.

(21) Appl. No.: 09/558,540

(22) Filed: Apr. 26, 2000

(30) Foreign Application Priority Data

Apr. 27, 1999 (FI) ........................................................ 990946

(51) Int. Cl.⁷ ................................................ G11C 16/04
(52) U.S. Cl. ................................. 365/185.03; 365/185.01
(58) Field of Search ......................... 365/185.03, 185.01, 365/185.27, 47; 250/286

(56) References Cited

U.S. PATENT DOCUMENTS

| | | | |
|---|---|---|---|
| 5,218,203 | * | 6/1993 | Eisele et al. ........................... 250/288 |
| 5,227,628 | * | 7/1993 | Turner .................................... 250/286 |
| 5,834,771 | * | 11/1998 | Yoon et al. ............................ 250/286 |
| 6,124,592 | * | 9/2000 | Spangler ................................ 250/287 |

* cited by examiner

Primary Examiner—David Nelms
Assistant Examiner—Thong Le
(74) Attorney, Agent, or Firm—Kubovcik & Kubovcik

(57) ABSTRACT

An ion drift tube for ion mobility spectrometers (IMS) and electron capture detectors (ECD) including a reaction region, a drift region and ion collectors, wherein analog memory cells with exposed floating gates are used for the movement and detection of ions. The floating gates of the analog memory cells are programmed to suitable potentials to develop electric fields along the axis of the reaction region and the drift region for the movement of the ions generated in the reaction region into the drift region. The exposed floating gates of the analog memory cells in the drift region are also used for collecting the ions and the charges of the collected ions are determined by the changes that take place in the potentials of the floating gates of the analog memory cells.

3 Claims, 1 Drawing Sheet

ION DRIFT TUBE INVOLVING ANALOG MEMORY CELLS

BACKGROUND OF THE INVENTION

1. Field of the Invention

The present invention relates to ion mobility spectrometers (IMS) and electron capture detectors (ECD) comprising ion drift tubes comprising reaction regions, drift regions and ion collectors, wherein analog memory cells with exposed floating gates are used for the movement and detection of ions. The floating gates of the analog memory cells are programmed to suitable potentials to develop electric fields along the axis of the reaction region and the drift region for the movement of the ions generated in the reaction region into the drift region. The exposed floating gates of the analog memory cells in the drift region are also used for collecting the ions and the charges of the collected ions are determined by the changes that take place in the potentials of the floating gates of the analog memory cells.

2. Description of Prior Art

Ion mobility spectrometers (IMS) and electron capture detectors (ECD) for gas chromatographs and mass spectrometers have been developed for the detection and analysis of organic vapors, contaminants in the atmosphere and trace amounts of combat gases among other things. A typical drift tube used in these instruments comprises a reaction region for generating ions, a drift region for separating the ions and one or more ion collectors for collecting and detecting the charges of the ions. Sometimes a shutter grid is positioned between the reaction region and drift region which controls the flow of ions into the drift region. A carrier gas together with a sample gas introduced into the drift tube through the inlet is ionized by a radioactive source in the reaction region. Other methods such as photoionization have also been proposed or used for generating the ions.

The ions formed through these processes move to the ion collector(s) under the influence of an electric field which is applied along the axis of the ion drift tube. The mixture of ions is separated into individual ions before arrival at the collectors by the collision with drift gas molecules which normally flow in the opposite direction of ion flow and each ion shows unique mobility due to their mass, size, and charge. The separated ions produce an electric current upon contact with the collectors. The individual ion mobilities and the resulting currents of the ions arriving at the different collectors provide a basis for the identification of the chemical species and amounts originally introduced into the reaction region.

The specificity and sensitivity of prior art drift tubes is largely limited by the means used for measuring the small currents generated by the collected ions. Conventional electrometer circuits are only capable of measuring currents down to a few femtoamps ($10^{-15}$ A) at best even when the collectors have a large surface area. Therefore there have been many attempts to develop charge detectors for ion mobility spectrometers, gas chromatographs and mass spectrometers of new design having better specificity and sensitivity, smaller size, easier manufacturing method and lower cost.

SUMMARY OF THE INVENTION

The object of the present invention is to provide a method and apparatus for moving and detecting the ions in an ion drift tube for use in ion mobility spectrometers and electron capture detectors for gas chromatographs and mass spectrometers. The ion drift tube according to the present invention comprises analog memory cells with exposed floating gates to develop electric fields along the axis of the reaction region and the drift region for the movement of ions from the reaction region to the drift region. The ion collectors in the drift region also comprise analog memory cells with exposed floating gates for collecting the ions and the charges of the collected ions are determined by measuring the changes that take place in the potentials of the floating gates. Due to the small capacitance and excellent charge retention properties of floating gate analog memories, changes in the floating gate potential corresponding to charges as low as $10^{-16}$ coulombs can be reliably and rapidly detected.

The present invention also utilizes a plurality of floating gate analog memory cells on a semiconductor substrate instead of conductive rings, conductive plates, conductive disks, or conductive or resistive coatings as in prior art drift tubes and chambers to develop the electric fields along the axis of the ion drift tube for moving, collecting and detecting the ions, so an IMS or ECD made by using the present invention can be of small size and low cost. As it is easy and fast to control the potential of the floating gates of the analog memory cells by electrical programming, uniform and programmable electric fields may be developed in the reaction region and the drift region. Arrays of various patterns of analog memory cells can be made reproducibly and with low cost on a single semiconductor substrate in mass production using conventional semiconductor processing technology.

The drift tube for use in ion mobility spectrometers and electron capture detectors according to the present invention can be produced by an easy manufacturing method, has high specificity, high sensitivity, small size and low cost.

DETAILED DESCRIPTION OF THE INVENTION

Figure 1:
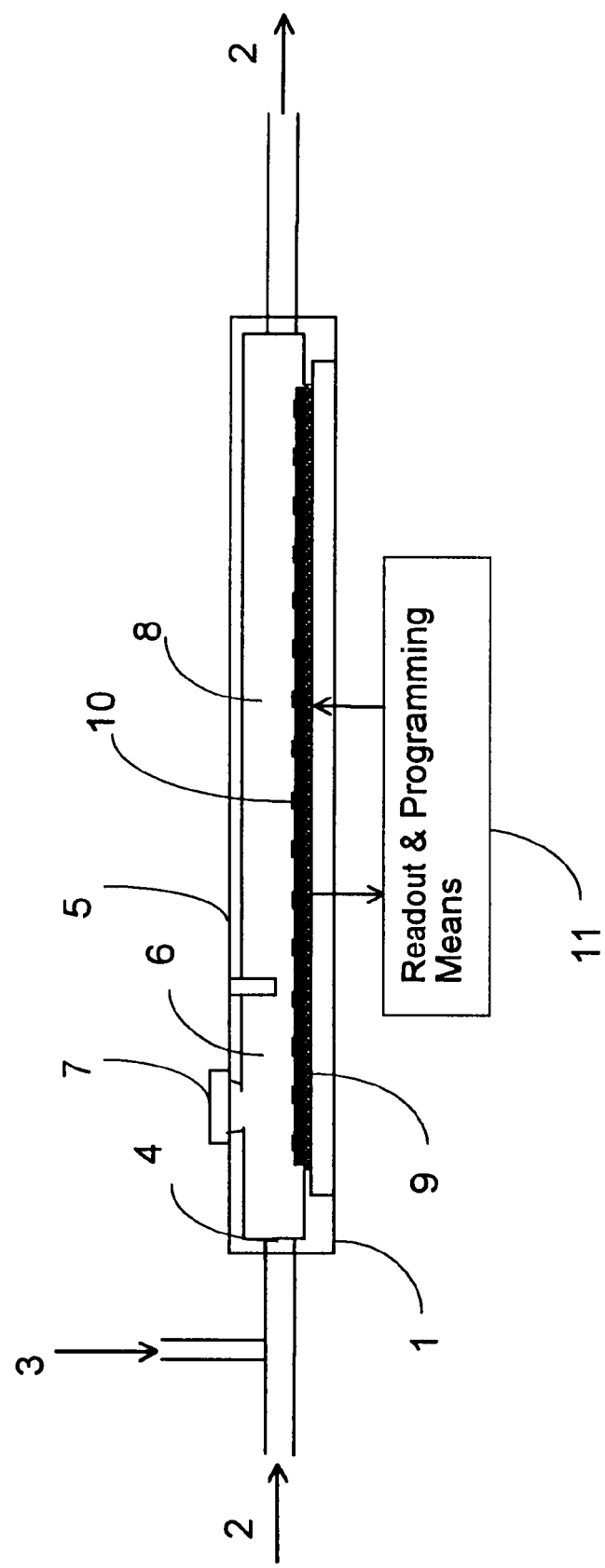
FIG. 1 depicts a drift tube according to the present invention.

The invention provides analog memory cells with exposed floating gates for developing electric fields along the axis of an ion drift tube made of dielectric material. Memory cell patterns on the surface of the tube may consist of rows and columns separated from each other and electrically connected to programming and readout means. The pattern of memory cells should be large enough to enclose the reaction region and the drift region. Through electrical programming the floating gates of the analog memory cells are placed at different potentials relative to their positions of the tube or chamber, so that a uniform and programmable electric field can be developed along the axis of the drift tube.

In the present invention a material having chemical resistance, for example, conductive teflon or ceramics may be coated onto the exposed surfaces of the floating gates of the analog memory cells.

Referring to FIG. 1, a drift tube 1 of an ion mobility spectrometer (IMS) is shown for identifying one or more constituents in a sample gas. A carrier gas 2 with sample gas 3 passes through inlet port 4 of housing 5 into a reaction region 6. A radioactive Am-241 source 7 is attached to an opening in the wall of the housing in the reaction region. The carrier gas may be, for example, a high purity gas, such as nitrogen or purified air, as well as ambient air. Sample gas 3 may be injected into the carrier gas by means of, for example, an orifice, a syringe, a membrane inlet, an injection port, as well as a gas chromatographic column in gas chromatography. A preconcentration device, or other suitable sample delivery means depending on various applications may be used.

The reaction region 6 and drift region 8 are surrounded by the dielectric housing 5 with high temperature compatibility and chemical resistance. A patterned semiconductor substrate 9 with an analog memory cell array 10 is fixed onto the outer surface of the housing 5. The memory cell array has several parallel memory cell rows and columns. The memory cell rows and columns are apart from each other and electrically connected to readout and programming means 11.

The performance of the IMS depends on the number of memory cells and the size of the memory cell array.

It is obvious for those skilled in the art that several different embodiments are possible within the scope of the claims presented herewith.

I claim:

1. An ion drift tube comprising:

a reaction region and a drift region;

an inlet for introducing a carrier gas into the reaction region;

an ionization source in the reaction region;

a semiconductor substrate having a plurality of analog memory cells with exposed floating gates, the substrate fixed onto the surface of the ion drift tube, wherein the potentials of said floating gates are electrically programmable to develop electric fields within the axis of the reaction region and the drift region for the movement of ions from the reaction region to the drift region and for the collection and detection of the ions entering the drift region.

2. The ion drift tube according to claim 1, further comprising a programming means for electrically programming the floating gates of the analog memory cells to a predetermined potential.

3. The ion drift tube according to claim 1, further comprising a readout means for determining the potential of the floating gates of the analog memory cells.

* * * * *